(12) United States Patent
Turner et al.

(10) Patent No.: US 7,072,089 B2
(45) Date of Patent: Jul. 4, 2006

(54) SINGLE TORSIONAL HINGE MIRROR

(75) Inventors: Arthur Monroe Turner, Allen, TX (US); John W. Orcutt, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/004,459

(22) Filed: Dec. 3, 2004

(65) Prior Publication Data

US 2006/0119924 A1 Jun. 8, 2006

(51) Int. Cl.
*G02B 26/08* (2006.01)
(52) U.S. Cl. .................. 359/223; 359/224; 359/291
(58) Field of Classification Search ............... 359/291, 359/290, 292, 295, 298, 223, 224, 320
See application file for complete search history.

(56) References Cited

U.S. PATENT DOCUMENTS 6,069,725 A * 5/2000 Melville ................ 359/212

6,956,684 B1 * 10/2005 Orcutt ................ 359/198
2004/0027449 A1 2/2004 Turner et al.

OTHER PUBLICATIONS

Ikeda, M., et al., "PZT Thin-Film Actuator Driven Micro Optical Scanning Sensor By 3D Integration of Optical and Mechanical Devices," 1999 IEEE, pp. 435-440.

* cited by examiner

*Primary Examiner*—Hung Xuan Dang
*Assistant Examiner*—Tuyen Tra
(74) *Attorney, Agent, or Firm*—William B Kempler; W. James Brady, III; Frederick J. Telecky, Jr.

(57) ABSTRACT

The present invention provides a single torsional hinge device, such as a mirror, adapted for use as a pivoting mirror and preferably a pivoting mirror oscillating at a resonant frequency about the single hinge. The single torsional hinge mirror reduces or substantially eliminates stresses on the torsional hinge mirrors caused by mismatched mounting levels of the support structure and/or differences of the coefficient and thermal expansion of materials in the mirror and support structures. The mirror may include a single layer of silicon having a reflective surface or may be a multilayered mirror wherein silicon is used for the torsional hinges and support and silicon or other materials may be used as the reflecting surface.

14 Claims, 5 Drawing Sheets

SINGLE TORSIONAL HINGE MIRROR

TECHNICAL FIELD

The present invention relates generally to the field of torsional hinge MEMS devices such as scanning engines. More particularly, the invention relates to a mirror or other torsional hinge device that pivotally oscillates about an axis. A torsional hinged mirror may be used by laser printers, and should have a resonant frequency that is substantially immune from stresses created by temperature variations and other mechanical sources transmitted to the resonating member through the torsional hinges.

BACKGROUND

The use of rotating polygon scanning mirrors and laser printers to provide a beam sweep or scan of the image of a modulated light source across a photosensitive medium, such as a rotating drum, is well known. In addition, there have also been efforts to use a much less expensive flat mirror with a single reflective surface such as a mirror oscillating in resonance to provide the scanning beam.

For example, the use of a single flat mirror with a pair of torsional hinges has been used for providing the horizontal scan or sweep of the laser beam. The pair of torsional hinges provide the oscillating beam sweep, which is typically a resonant beam sweep. In addition, other devices having torsional hinges that oscillate at the resonant frequency of a device have been contemplated.

Consequently, it will be appreciated that the high frequency resonating device, such as a scanning mirror, is a key component to the success of products such as laser printers. Further, since many of the applications for such devices, including mirror projection displays, are battery powered, and therefore, all of the components including the scanning mirror or resonant movement of the device must be energy efficient. As an example, Texas Instruments presently manufactures mirror MEMS devices fabricated out of a single piece of material (such as silion, for example) typically having thickness of about 115 to 125 microns using semiconductor manufacturing processes. The layout of such a mirror consists of a mirror having dimensions on the order of a few millimeters pivotally supported by torsional hinges. The torsional hinges extend from the mirror member of the device to a support frame or alternately, the hinges may extend from the mirror device to a pair of hinge anchors. This Texas Instruments manufactured mirror is particularly suitable for use with laser printers on projection device displays. The reflective surface of the mirror may have any suitable perimeter shape such as oval, elongated ellipse, rectangular, square or other.

U.S. Patent Application No. 2004/0027449, filed Mar. 10, 2003 and entitled "Laser Print Apparatus Using a Pivoting Scanning Mirror" describes several techniques for creating the pivotal resonance of the mirror device or any other resonant member about torsional hinges. Thus, by designing the hinges to resonant at a selected frequency, an engine can be produced that, in the case of a mirror, provides a scanning beam sweep with only a small amount of energy required to maintain resonance.

However, as will be appreciated by one skilled in the art, the resonant frequency of a pivotally oscillating device about torsional hinges will vary as a function of the stress loading along the axis of the hinges. These stresses build up as a result of residual stress on the hinge from the assembly process as well as changes in the environmental conditions, such as for example, changes in the temperature of the package device. For example, the coefficient of thermal expansion of silicon is different than that of most packaging materials such as stainless steel or plastic. As the temperature varies, these materials expand and contract at different rates. A MEMS type pivotally oscillating device, which is made of Si and attached to the package is constrained in the hinge direction and will experience stress in the hinges as the temperature changes. This in turn will lead to drift in the resonant frequency of the pivotal oscillations.

Since applications that use a pattern of light beam scans, such as laser printing and projecting imaging, require a stable precise drive to provide the single frequency of the scan velocity, the changes in the resonant frequency and scan velocity of a pivotally oscillating device, such as the mirror, due to temperature variations can restrict or even preclude the use of the device in laser printers and scan displays. Further, if the stress loading of the torsional hinges is increased above the maximum acceptable level for a given rotational angle, the reliability and operational life of the device or mirror can be unacceptably reduced. For example, excessive compressing stress loading that can occur at a low temperature on a device with a CTE (coefficient of thermal expansion) mismatch can lead to buckling of the hinge along with dramatic shift of the resonant frequency or even catastrophic failure.

Various techniques are now used to reduce stress on the torsional hinge devices or mirrors due to temperature and other causes. Unfortunately, these techniques add cost to the overall device or mirror and support structure making up, for example, a laser drive package.

Therefore, an inexpensive torsional hinge device, such as a mirror, having a resonant frequency that is substantially indifferent to the effects of significantly different CTE's of a support structure and mirror combination and other sources of stress transmitted through the torsional hinges, would be advantageous.

SUMMARY OF THE INVENTION

These and other problems are generally solved or circumvented, and technical advantages are generally achieved, by preferred embodiments of the present invention which comprise a pivotally oscillating structure supported by a torsional hinge that is immune to stresses typically transmitted to a device having a pair of torsional hinges. The apparatus of the present invention is a device for pivoting about a selected axis and comprises a support member and a functional surface such as for example, a mirror, and is suitable for use in a using device such as a printer, etc. The device further includes a single torsional hinge lying along the selected axis and has a first end attached to the functional surface and a mounting end of the hinge that is fixedly secured to the support member such that the functional surface or mirror can pivot on the single torsional hinge about the selected axis. Typically, the device will further comprise an axial member having a first end that is attached to the functional surface such as for example, a mirror, and a free end. The free end extends away from the functional surface along the selected axis and is preferably received by an axial support that constrains movement of the axial support member in a plane perpendicular to the selected axis while allowing the free end of the axial member to rotate. The axial support may be a hub member mounted to the surface of the support structure of the using device. Alternately, the axial support may be an aperture defined in the support structure for receiving the axial member. A driving mechanism is also included that provides a pivoting motion of the functional or reflecting surface to pivot around the selected axis. Typically, the pivoting of the device around the selected axis is a back and forth oscillation and preferably at a selected frequency, such as the resonant frequency of the device. The driving mechanism may for example, comprise a permanent magnet attached to the functional surface or reflecting surface of a mirror and an electromagnetic coil located next to or proximate the permanent magnet for selectively providing a magnetic force.

According to another embodiment, the mirror is a multilayer device comprising the functional surface or mirror, a spacer layer having a front side and a back side and a hinge layer. The single torsional hinge layer further comprises an attaching portion integrally formed with the hinges. The spacer layer back side is bonded to the attaching portion of the single torsional hinge and the front side of the spacer layer is bonded to the back surface of the functional member. A permanent magnet may be bonded to the back side of the hinge layer to provide the drive power.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Like reference number in the figures are used herein to designate like elements throughout the various views of the present invention. The figures are not intended to be drawn to scale and in some instances for illustrative purposes, the drawings may intentionally not be to scale. One of ordinary skill in the art will appreciate the many possible applications and variations of the present invention based on the following examples of possible embodiments of the present invention.

Figure 1A:
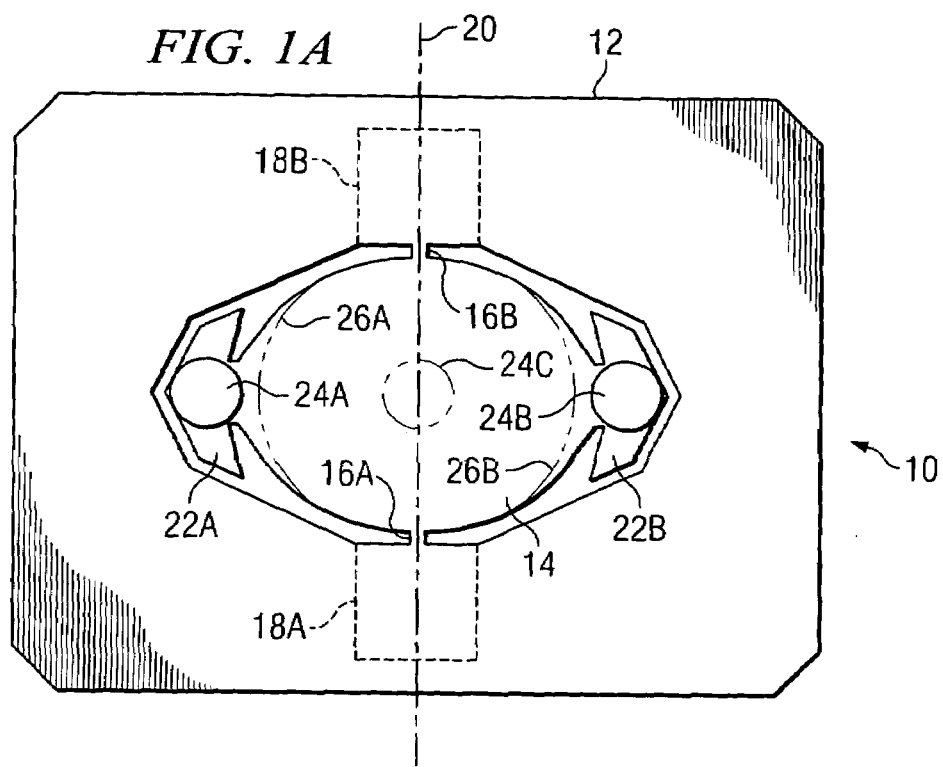
FIGS. 1A and 1B are prior art illustrations of a pivoting device such as a mirror supported by a pair of torsional hinges.

Referring now to the prior art FIG. 1A, mirror device 10 includes a reflecting surface 14 supported by a pair of torsional hinges 16a and 16b. A frame member 12 or alternately, a pair of anchor pads 18a and 18b, supports the device 10 along a selected axis 20. According to one embodiment, the mirror device 10 may also include a pair of tabs 22a and 22b for supporting a pair of magnets 24a and 24b used to pivot the reflecting surface or mirror member 14 about selected axis 20. Alternately, the tabs may be omitted as indicated by dashed lines 26a and 26b and a single magnet 24c may be bonded to the back side of the pivoting reflecting surface 14.

Figure 1B:
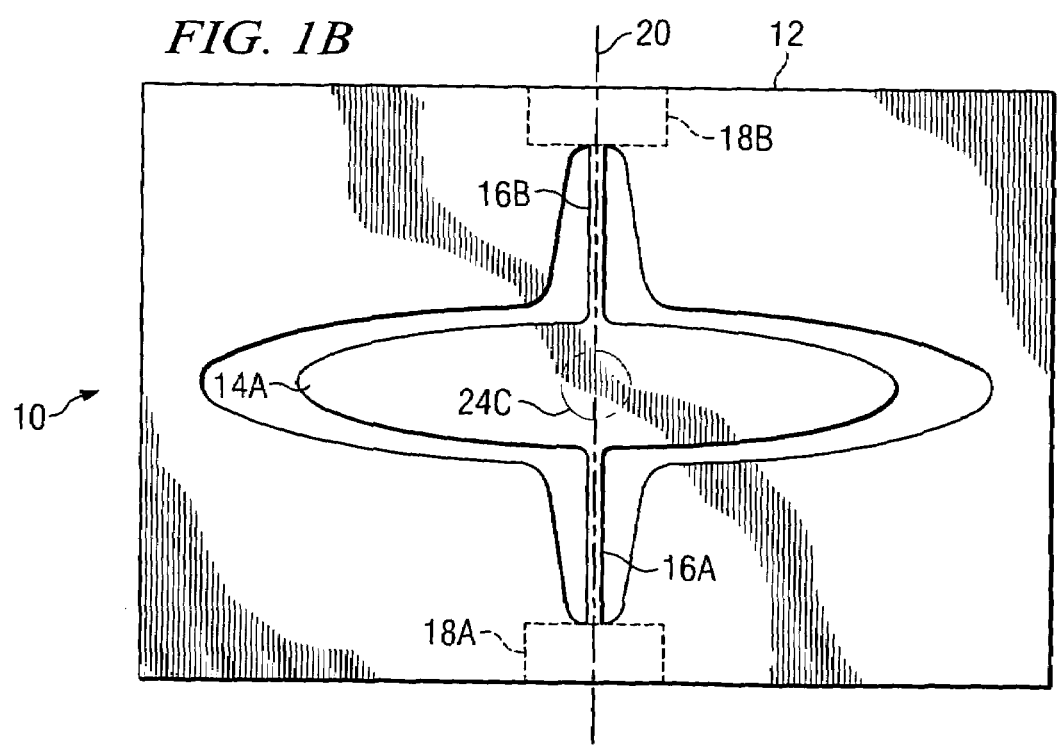

Referring now to FIG. 1B, there is shown another embodiment of a typical single axis mirror device. The operation of the mirror is FIG. 1B is substantially that as discussed with respect to FIG. 1A except the mirror portion 14a has a long elliptical shape. Consequently, FIG. 1B uses the same reference numbers as FIG. 1A to identify similar components of the mirror. The mirror of FIG. 1B can also be driven by permanent magnets attached to the tips of the elongated ellipse, but is shown with the center magnet 24c.

Figure 2A:
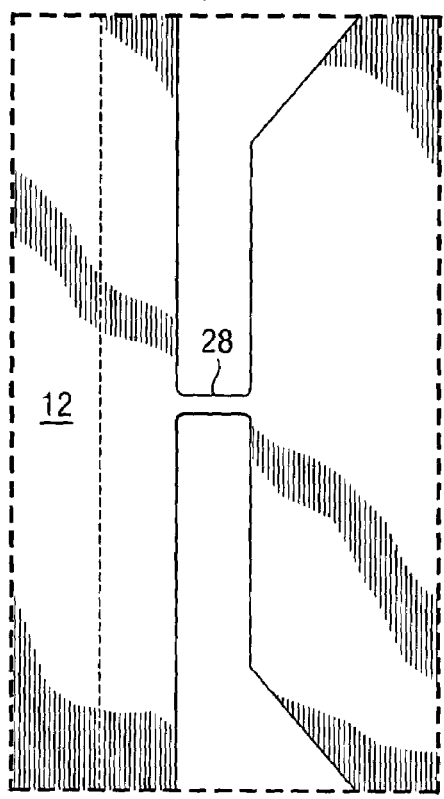
FIGS. 2A, 2B and 2C illustrate an unstressed hinge, a hinge in compression and a torsionally stressed hinge of the type shown in FIG. 1A.
Figure 2B:
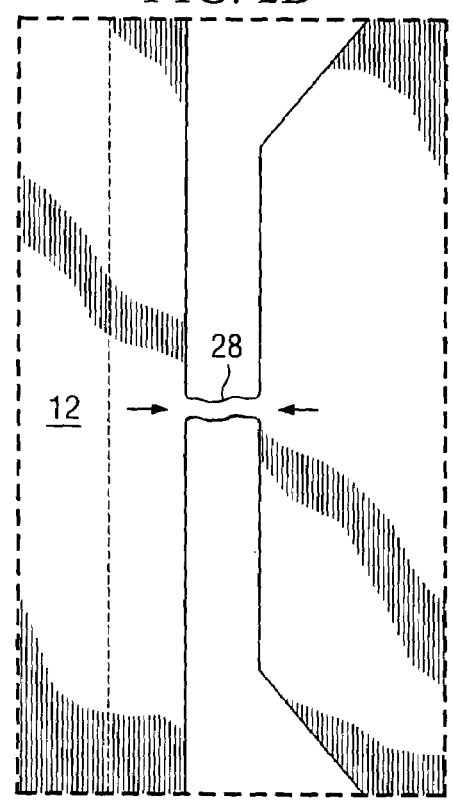
Figure 2C:
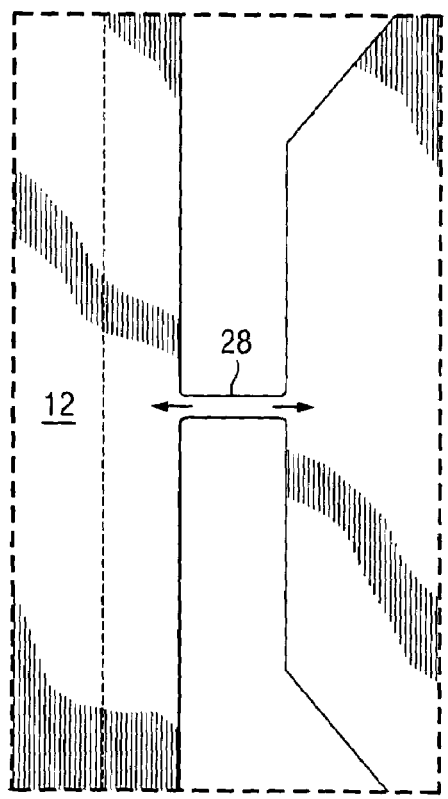
Figure 3:
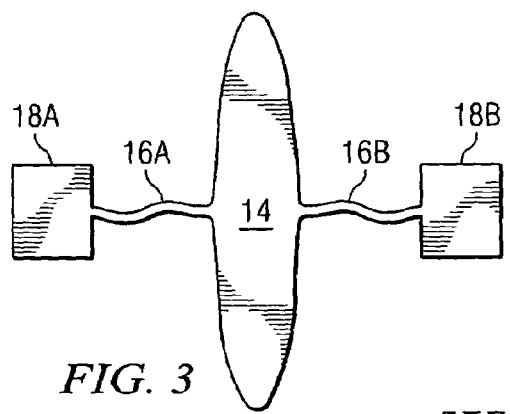
FIG. 3 illustrates a hinge of the type shown in FIG. 1B having anchor members under compression forces.

As was discussed above, the torsional hinges may be affected by stress on the support members or frame of the mirror device. Therefore, as shown in FIGS. 2A, 2B and 2C, hinges similar to those of 16a and 16b of FIG. 1A are illustrated with respect to different stresses. For example, FIG. 2A shows an unstressed hinge 28, FIG. 2B shows a hinge 28 in compression and FIG. 2C shows the same hinge in tension. FIG. 3 on the other hand, shows the single axis scanning mirror of FIG. 1B with anchor pads 18a and 18b. The mirror of FIG. 3 is also under compressive stress. Therefore, it will be appreciated that the application of the teachings of this invention is applicable to mirrors supported by anchor pads and/or support frames.

Figure 4A:
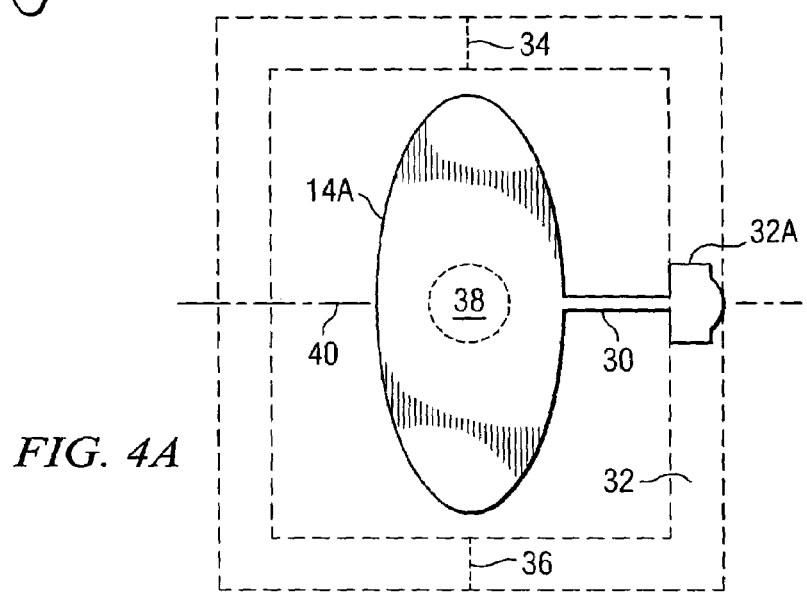
FIGS. 4A and 4B illustrate the single torsional hinge device of the present invention without and with a corresponding axial member respectively.
Figure 4B:
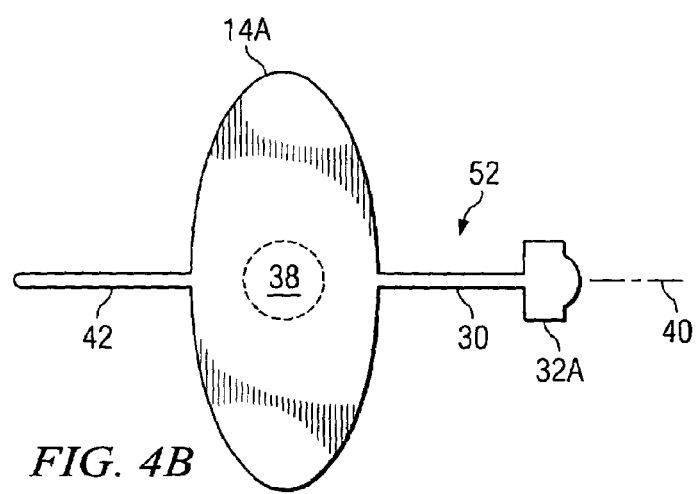

Referring now to FIGS. 4A and 4B, there are shown embodiments of a torsional hinge mirror according to the teaching of the present invention, suitable for use in a device, such as for example only, a printer. Those components and elements of the mirror of the invention as illustrated in FIGS. 4A and 4B and also in FIG. 5 will carry the same reference numbers as the common elements in the previously discussed figures. As shown in FIG. 4A, there is an elongated ellipse mirror portion 14a supported by a single torsional hinge 30. The other end of the torsional hinge is part of an anchor member. The anchor member as was discussed heretofore, may include a complete frame 32 around the mirror structure, or simply be an anchor pad 32a as shown in FIG. 4A. Further, as shown, the anchor member could extend as a full frame around the mirror structure or a half frame as shown by dividing lines 34 and 36. It will also be appreciated that the frame portion could be any selected size and portion of the frame member 32. Also included on the bottom side as illustrated by dashed line is a single permanent magnet 38 for providing pivotal forces. Thus, as seen, the mirror structure of FIGS. 4A and 4B will pivot around pivot axis 40 on single torsional hinge 30 at a selected frequency, and preferably at the resonant frequency of the torsional mirror and hinge structure. A mirror structure similar to that shown in FIG. 4A has been found to reach a resonant frequency and operate quite satisfactorily. However, as will be appreciated, because the mirror portion is supported as a cantilever member by the torsional hinge 30, the mirror is susceptible to forces in a plane perpendicular to the axis 40 of the mirror device. Consequently, referring to FIG. 4B, there is illustrated a mirror structure substantially similar to that discussed with respect to FIG. 4A having an anchor pad 32a and further includes an axial member 42 extending along the selected axis and away from the mirror structure. As shown, the axial member does not include another anchor pad but will be supported in a plane perpendicular to the axis as illustrated in FIG. 5.

Figure 5:
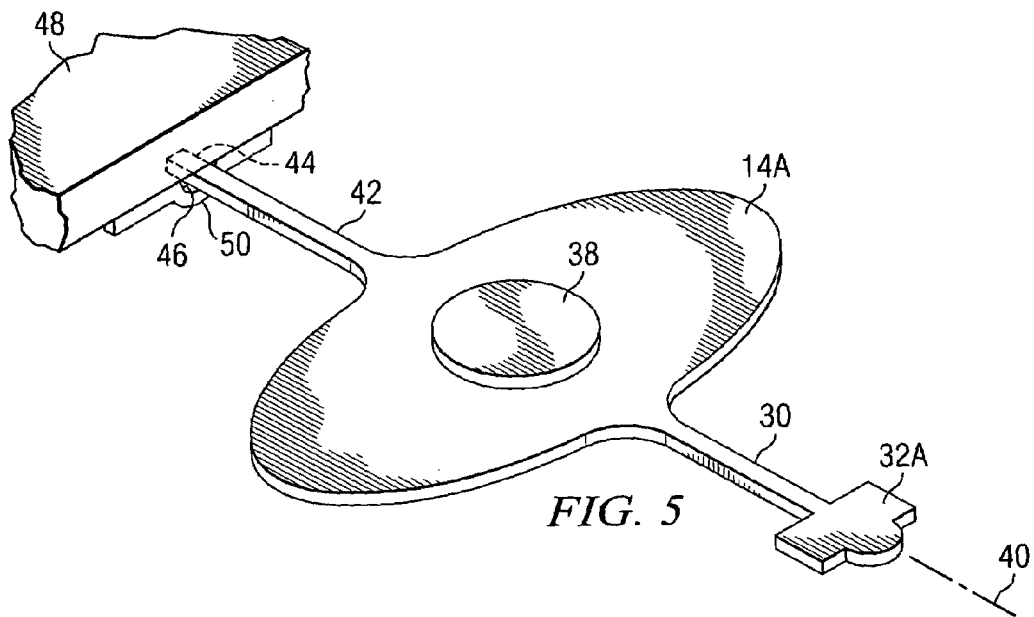
FIG. 5 illustrates the device of FIG. 4b and further includes an axial support member.

Referring now to FIG. 5, there is shown a bottom view of the mirror structure of FIG. 4B illustrating the support structure for the axial member 42. In the embodiment illustrated in FIG. 5, the anchor pad 32a will be attached to a supporting structure (not shown) and the extreme end 44 of the axial member may lay in a groove 46 on top of another portion 48 of the support member and then held in place via an axial hub or support member 50. Thus, the axial member 42 is free to rotate, but is substantially restrained from movement in a plane perpendicular to the selected axis 40. It will also be appreciated by those skilled in the art that the support structure may simply comprise a hole or aperture drilled into the support structure for receiving the extreme end of the axial member. Such an embodiment is shown is in FIG. 7 and will be discussed hereinafter with respect to a multilayered mirror but is equally applicable to the single layer mirror of FIG. 4B.

Figure 6A:
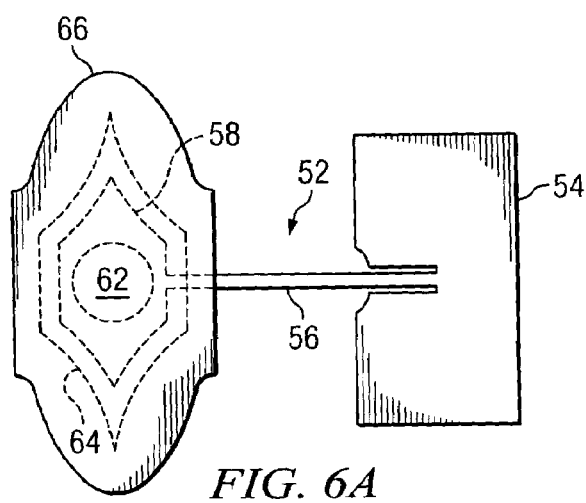
FIGS. 6A and 6B are multilayer versions of the single torsional hinge device of the present invention also without and with the axial support member respectively.
Figure 6B:
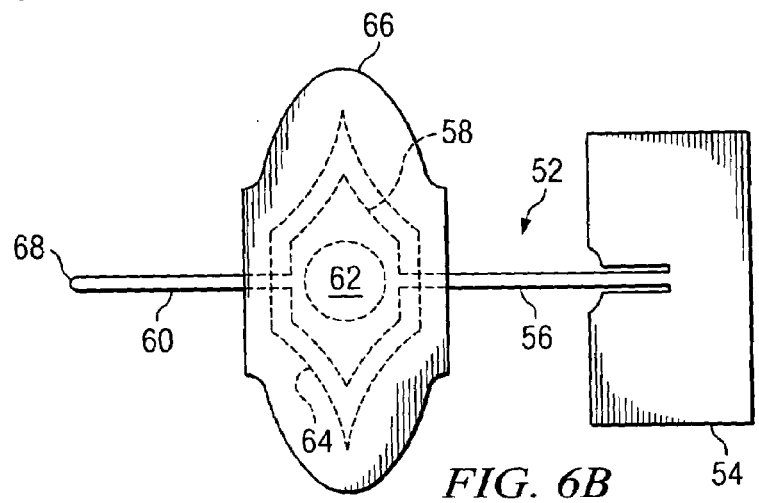
Figure 7:
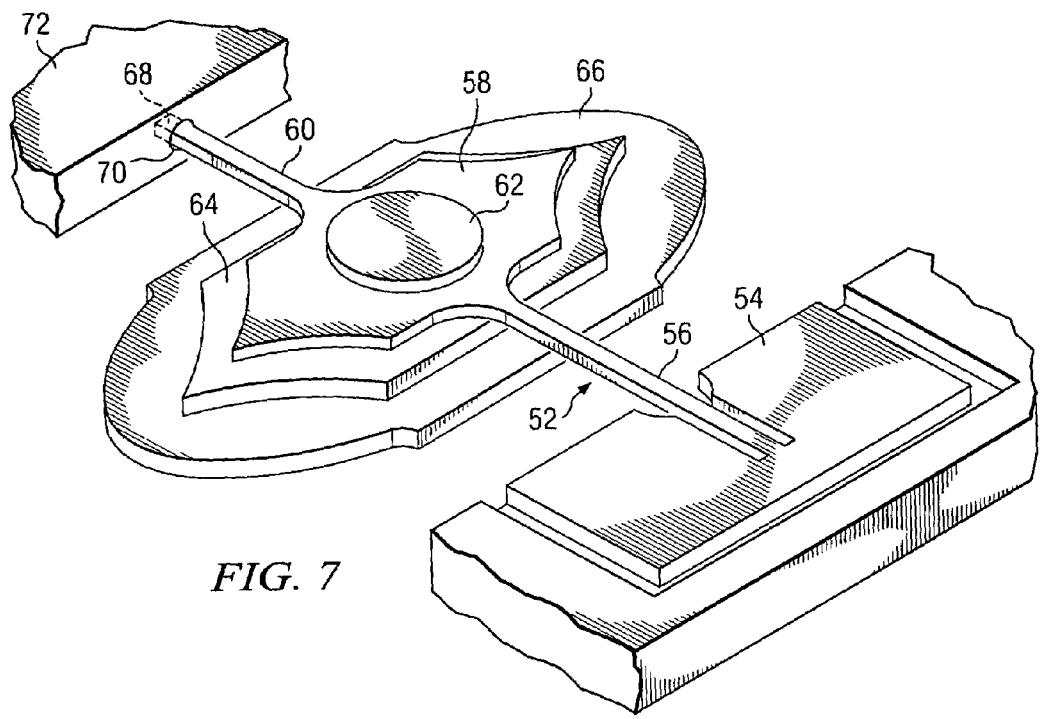
FIG. 7 is the same as FIG. 6B and further includes an axial support member.

Referring now to FIGS. 6A and 6B, there are shown top views of mirror structure embodiments that are substantially similar to those shown with respect to FIGS. 4A and 4B except the mirror structure is multilayered. A bottom view of this structure mounted for pivoting is illustrated in FIG. 7. Therefore, as shown in FIGS. 6A, 6B and 7, the mirror structure includes a hinge layer 52 comprising an anchor pad 54, a single torsional hinge 56 and a mirror attachment portion 58 as illustrated in the figures. FIG. 6A illustrates the hinge layer 52 without the axial member 60 and FIGS. 6B and 7 show the axial member. The hinge layer 52 includes a magnet side and a mirror side and, as shown, a permanent magnet 62 is secured to the magnet side of the hinge layer. A spacer layer 64 having a front side, a back side and a selected thickness and mass may be used. The back side of the spacer layer 64 is secured to the mirror side of the hinge layer 52. There is also a mirror layer 66 that includes the reflecting surface and a back side which is bonded to front side of the spacer layer. The spacer layer 64 is selected to have a mass, weight and size such that the mass moment of the entire combined structure with the permanent magnet 62 will lie on the pivotal axis that passes through the hinges in the hinge layer 52. As was mentioned above, the extreme end 68 of the axial member is supported by an aperture 70 provided in part of the support member 72 as shown in FIG. 7. It will also be appreciated, of course, that the axial member 60 could be supported by hub member, such hub member 50 as was discussed with respect to FIG. 5.

Figure 8:
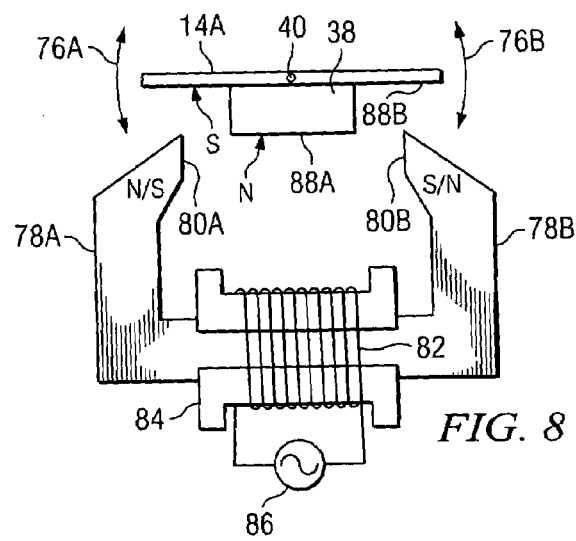
FIG. 8 is a diagrammatical view showing an example of an electromagnetic coil structure interacting with the permanent magnet bonded to the mirror to provide pivotal motion.

Referring now to FIG. 8, there is shown a cross sectional view of a suitable drive mechanism suitable for use with the mirror structure of FIGS. 5 and/or 7. The drive mechanism of FIG. 8 is shown only as an example, and it will be appreciated by those skilled in the art that various other drive mechanisms may be used to pivotally oscillate the mirror. Elements of FIG. 8 that are the same as the elements of FIG. 5 carry the same reference numbers. Therefore, as shown, the pivoting mirror member 14a is supported along its pivoting or selected axis 40 by a torsional hinge, not shown. Thus, the mirror 14a is free to pivot about the selected axis 40 as indicated by arcurate arrows 76a and 76b. Also as shown, the mirror member 14a of the mirror device includes a permanent magnet 38 mounted with its north/south pole or axis perpendicular to the surface of the mirror member 14a. Also shown are the core pieces 78a and 78b, which extend to end points 80a and 80b. A conductive wire is wound around the core pieces 78a and 78b to provide a multiplicity of windings 82. The two ends of the wire wound around a plastic bobbin 82 and the core pieces are connected to an alternating power source 86 for providing an alternating current through the windings 82. Thus, it will be appreciated that the core ends 80a and 80b will continually change between a north pole and a south pole. The cores are also wound such that when pole 80a is positive (north), pole 80b is negative (south), and when pole 80b is north, 80a is south. Thus, when pole 80a has a south orientation, the north pole 88a of permanent magnet 38 will be attracted to pole 80a while at the same time the north pole orientation of 80b will repel north pole 88a of the permanent magnet 38 and attract south pole 88b. Then, as will be appreciated by those skilled in the art, when pole 80a has a north orientation and pole 80b has a south orientation, the magnet 38 and mirror member 14a will pivot in the opposite direction. Further, as will be appreciated, the mirror member 14a of the mirror device will preferably have a resonant frequency about the selected axis and if the alternating current supplied by power source 86 is set to pivot the mirror member 14a at this resonant frequency, the mirror will pivotally oscillate at the resonant frequency with a minimum amount of power being used.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device for pivoting about a selected axis comprising:
 a support member;
 a using device for mounting said support member;
 a functional surface;

a single torsional hinge lying along said selected axis and having a mirror end fixedly supporting said functional surface and a mounting end of said hinge fixedly secured to said support member such that said functional surface can pivot on said single torsional hinge about said selected axis with respect to said support member; and further comprising an axial member having a first end attached to said functional surface and a free end, said free end extending away from said functional surface along said selected axis.

2. The device of claim 1 further comprising an axial support for receiving said free end of said axial member, said axial support constraining movement of said axial member in a plane perpendicular to said selected axis while allowing said free end of said axial member to rotate.

3. The device of claim 2 further comprising a structure for mounting said support member and said axial support.

4. The device of claim 1 further comprising a driver for causing said functional surface to pivot around said selected axis.

5. The device of claim 4 wherein said functional surface oscillates around said selected axis at a selected frequency.

6. The device of claim 5 wherein said selected frequency is the resonant frequency of said device.

7. The device of claim 4 wherein said driver comprises a permanent magnet attached to said device and an electromagnetic device proximate said permanent magnet for selectively providing a magnetic force thereto.

8. The device of claim 1 wherein said functional surface is part of a mirror member, said mirror member comprising a reflecting surface and a back surface fixedly secured to said single torsional hinge.

9. The device of claim 8 wherein said single torsional hinge is made of silicon.

10. The device of claim 8 further comprising a spacer layer having a front side and a back side wherein said mirror end of said single torsional hinge further comprises an attaching portion integrally formed therewith, said spacer layer back side bonded to said attaching portion of said single torsional hinge and said front side bonded to said back surface of said mirror member.

11. The device of claim 10 wherein said single torsional hinge is made of silicon.

12. The device of claim 10 further comprising a permanent magnet attached to said attaching portion of said torsional hinge.

13. The device of claim 12 wherein the thickness and mass of said spacer layer is selected such that the mass of said mirror member and said spacer layer is substantially equal to the mass of said permanent magnet and the total mass moment of said device is located substantially on said selected axis.

14. The device of claim 13 further comprising an electromagnetic device proximate said permanent magnet for selectively providing a magnetic force thereto.

* * * * *